US006613647B2

United States Patent
Kim

(10) Patent No.: US 6,613,647 B2
(45) Date of Patent: *Sep. 2, 2003

(54) SEMICONDUCTOR DEVICE HAVING A TRENCH ISOLATION STRUCTURE AND METHOD FOR FABRICATING THE SAME

(75) Inventor: Do-Hyung Kim, Seoul (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

This patent is subject to a terminal disclaimer.

(21) Appl. No.: 10/135,898

(22) Filed: Apr. 29, 2002

(65) Prior Publication Data

US 2002/0158302 A1 Oct. 31, 2002

(30) Foreign Application Priority Data

Apr. 30, 2001 (KR) .......................... 2001-23458

(51) Int. Cl.$^7$ .............................................. H01L 21/76
(52) U.S. Cl. ...................................................... 438/424
(58) Field of Search ................... 257/374, 506, 257/510; 438/424, 425, 435, 437

(56) References Cited

U.S. PATENT DOCUMENTS 5,960,276 A * 9/1999 Liaw et al. ................. 438/224
6,486,039 B2 * 11/2002 Yoo et al. ................... 438/425
6,486,517 B2 * 11/2002 Park .......................... 257/510
2002/0070420 A1 * 6/2002 Oh et al. .................... 257/506
2002/0070430 A1 * 6/2002 Oh et al. .................... 257/622

* cited by examiner

*Primary Examiner*—Wael Fahmy
*Assistant Examiner*—Anh Duy Mai
(74) *Attorney, Agent, or Firm*—Marger Johnson & McCollom, P.C.

(57) ABSTRACT

A semiconductor device and its fabrication method are provided. A semiconductor device includes first and second trench regions formed in first and second areas of a semiconductor substrate, respectively. A first device isolation layer is formed in the first trench region and includes a first trench oxide layer formed on side walls of the first trench region. A first nitride liner is formed on the side walls of the first trench oxide layer and a first insulation layer pattern is formed on the first nitride liner to fill the first trench region. A second device isolation layer is formed in the second trench region and includes a second trench oxide layer formed on the side walls of the second trench region. A second nitride liner is formed on the side walls of the second trench oxide layer. A second insulation layer pattern is formed on the second nitride liner to fill the second trench region. The first trench oxide layer is substantially thicker than the second trench oxide.

3 Claims, 7 Drawing Sheets

SEMICONDUCTOR DEVICE HAVING A TRENCH ISOLATION STRUCTURE AND METHOD FOR FABRICATING THE SAME

RELATED APPLICATION

This application claims priority from Korean Patent Application No. 2001-23458, filed on Apr. 30, 2001, the contents of which are incorporated herein by this reference in their entirety.

BACKGROUND OF THE INVENTION

1. Field of the Invention

The present invention relates to a semiconductor device having a trench isolation structure and to a method for fabricating the same.

2. Description of the Related Art

As semiconductor devices become more highly integrated, various approaches have been used to further scaling down the semiconductor devices. Specifically, a cell array area of the semiconductor devices can be reduced by employing a shallow trench isolation structure (STI) instead of a local oxidation of silicon (LOCOS) isolation structure. But, the trench isolation structure is employed, various defects that affect various device characteristics can occur, because a semiconductor substrate is etched to form a trench region. Thus, several processing techniques are introduced to cure such defects generated during the formation of the trench region.

FIGS. 1 through 3 are process cross-sectional views illustrating a semiconductor device having a conventional trench isolation structure. In the drawings, the reference character "a" corresponds to a cell array region and the reference character "b" corresponds to a peripheral circuit region including PMOS transistors.

Referring to FIG. 1, a buffer oxide layer 102 and a hard mask layer 104 are formed on a semiconductor substrate 100. The hard mask layer and the buffer oxide layer are patterned using a photoresist pattern 106 as an etch mask to form the buffer oxide layer pattern 102 and the hard mask pattern 104, which are sequentially stacked.

Referring to FIG. 2, the photoresist pattern 106 is removed, and the semiconductor substrate 100 is etched using the hard mask pattern 104 as an etch mask to form a trench region. The trench region in turn defines an active region. Then, a trench oxide layer 108 is formed on the side walls of the trench region, and a nitride layer 110 is conformally formed on the side wall of the trench oxide layer 108. Continuously, an insulation layer 112 is formed to fill up the region surrounded by the nitride layer 110.

Referring to FIG. 3, the insulation layer 112 is planarized using a chemical mechanical polishing (CMP) process. As a result, a nitride liner 110a is formed on the trench oxide layer 108, and an insulation layer pattern 114 is formed in the region surrounded by the nitride liner 110a. Then, after recessing a top of the insulation layer pattern 114, the hard mask pattern 104 is removed using a wet etch of a phosphoric solution to form a device isolation layer.

As described above, in a conventional technique, trench isolation layers of the cell array region and the peripheral circuit region are formed at the same time. In other words, the thickness of the trench oxide layer in the cell array region is the same as that of the trench oxide layer in the peripheral circuit region. In this case, the thickness of the trench oxide layer directly affects the characteristic of MOS transistors formed in the active region. These problems are further explained through FIGS. 4 and 5.

FIG. 4 is a cross-sectional view illustrating a phenomenon where the device characteristics of the MOS transistor degrade if the thickness of the trench oxide layer is relatively thick.

Specifically, if a trench oxide layer 108a, that is, a trench thermal oxide layer formed on the side wall of the trench region is relatively thick, the top corner of the trench region develops a sharp recess, as shown in FIG. 4. Further, during the removal of the hard mask pattern 104 of FIGS. 1 and 2 and the buffer oxide layer pattern 102 of FIGS. 1 and 2, the trench oxide layer 108a can be over-etched, thereby forming a recessed region 40. A gate oxide layer 32 is formed on the active region of the resulting structure having the recessed region 40, and a gate electrode 34 is formed overlying the gate oxide layer 32 and the device isolation layer.

If recessed regions 40 are formed at the top corners of the trench region, even though a subthreshold voltage, i.e., the lower than a threshold voltage, is applied to the gate electrode 34, a channel can be formed on the top portions of the sidewalls of the trench region due to an inverse narrow-width effect. Here, the subthreshold voltage is. This is because a strong electric field is locally concentrated on the gate oxide layer 32 overlying the sharp top corners of the trench region. Consequently, undesirable leakage currents flow between the source region and the drain region in the MOS transistor. Further, the reliability of the gate oxide layer 32 degrades and a gate leakage currents increase. Specifically, when the inverse narrow-width effect occurs in a cell transistor of a DRAM, a short refresh period is required to increase power consumption.

FIG. 5 is a cross-sectional view illustrating the problem where characteristics of the MOS transistor degrade with a relatively thin trench oxide layer.

As illustrated in FIG. 5, if the trench oxide layer 108b is relatively thin, it is possible to prevent formation of the recessed region 40. Further, the top corner of the trench region can have a round shape. Thus, it is possible to improve the characteristics of the leakage currents resulting from the inverse narrow-width effect. However, the nitride liner 110a that covers the side wall of the trench oxide layer 108b is generally known to have a negative charge. Thus, in the case of a thin trench oxide layer 108b, the positive coupling charge can be induced on the sidewalls of a trench region, thus forming an undesirable P-channel. Consequently, if the trench oxide layer 108b is thin, the leakage current characteristic of the PMOS transistor degrades or malfunction thereof can occur.

SUMMARY OF THE INVENTION

Therefore, the present invention provides a semiconductor device having trench oxide layers of each different thickness at the region where an NMOS transistor of a cell array region and a PMOS transistor of a peripheral circuit are formed.

The present invention also provides a method for fabricating a semiconductor device that can form trench oxide layers of each different thickness at the region where an NMOS transistor of a cell array region and a PMOS transistor of a peripheral circuit are formed.

In order to approach the object, the present invention includes the first device isolation layer and the second device isolation layer formed in the first area and the second area of a semiconductor substrate, respectively. The first device isolation layer defines an active region of the first area. Likewise, the second device isolation layer defines another active region in the second area. The first device isolation layer consists of the first trench oxide layer, the first nitride liner and the first insulation layer pattern. Here, the first trench oxide layer is formed on the side walls of the first trench region, and the first nitride liner is formed on the side walls of the first trench oxide layer. The first insulation layer pattern fills the region surrounded by the first nitride liner. The second device isolation layer includes the second trench oxide layer, the second nitride liner and the second insulation layer pattern. Here, the second trench oxide layer is thinner than the first trench oxide layer on the side walls of the second trench region. The second nitride liner is formed on the side walls of the second trench oxide layer. The second insulation layer pattern fills the region surrounded by the second nitride liner.

According to one embodiment of the present invention, the active region between first trench regions corresponds to a peripheral circuit region including PMOS transistors, and the active region between the second trench regions corresponds to a cell array region. The first trench region and the second trench region are formed in the first area and the second area, respectively. Then, a first trench oxide layer is formed on the side walls of the first trench region. The second trench oxide layer is formed on the side walls of the second trench region. The second trench oxide layer is thinner than the first trench oxide layer. Next, the nitride layer is conformally formed on the side walls of the first trench oxide layer and the second trench oxide layer. Then, the first insulation layer pattern is formed in the first trench region to fill the region surrounded by the nitride layer. The second insulation layer pattern is formed in the second trench region to fill the region surrounded by the nitride liner. As a result, the first device isolation layer is formed in the first area, and the second device isolation layer is formed in the second area. Here, the second trench oxide layer is thinner than the first trench oxide layer.

According to another embodiment of the present invention, to form first and second trench oxide layers, a buffer oxide layer and a hard mask layer are sequentially formed on the semiconductor substrate having the first and the second areas. Then, the hard mask layer, the buffer oxide layer and the semiconductor substrate are sequentially patterned to form the first trench region in the first area. The first thermal oxidation process is performed on the resulting structure where the first trench region is formed. Next, the hard mask layer, the buffer oxide layer and the semiconductor substrate are sequentially patterned to form the second trench region in the second area. The second thermal oxidation process is performed on the resulting structure where the second trench region is formed. Thus, the first trench oxide layer is more thickly formed than the second trench oxide layer.

In the semiconductor device according to the present invention, the peripheral circuit including PMOS transistors is formed in the active region between the first trench regions. Also, the cell array region including cell transistors and capacitors is formed in the active region between the second trench regions.

DESCRIPTION OF THE PREFERRED EMBODIMENT

The present invention will be now described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In attached figures, the thickness of layers and regions is exaggerated for clarity. Also, when it is mentioned that a layer is on another layer or on a substrate, a layer can be directly formed on another layer or on a substrate, or the third layer can be interposed therebetween. The same reference numbers indicate the same components thorough the whole specifications.

Figure 1:
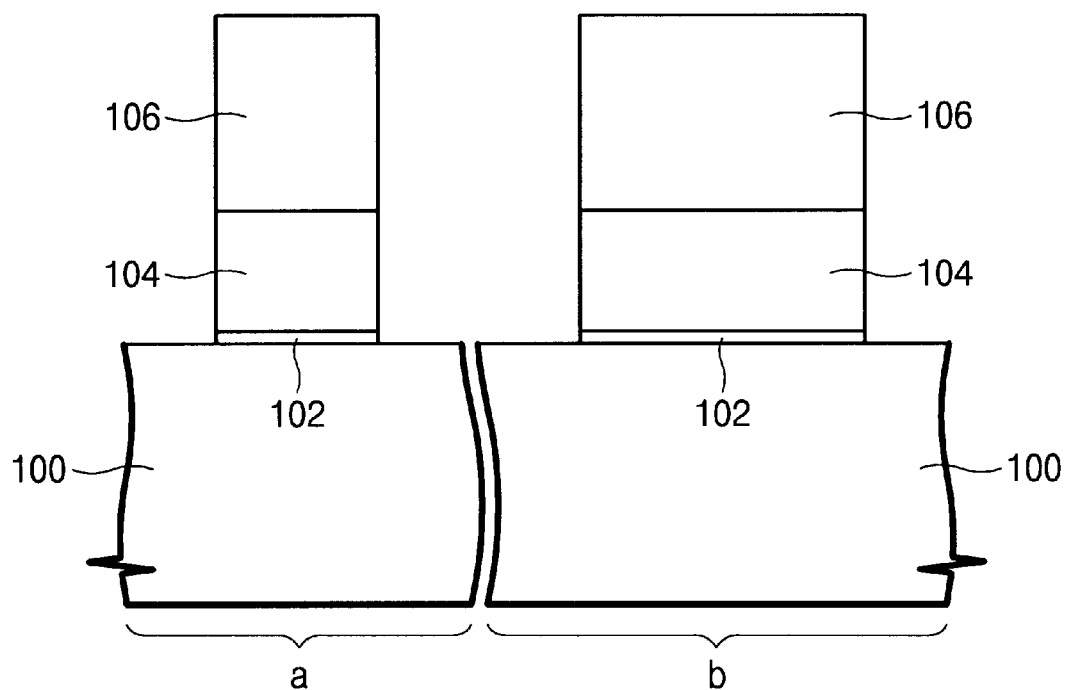
FIGS. 1 through 3 are cross-sectional views illustrating a conventional process for fabricating a semiconductor device.
Figure 2:
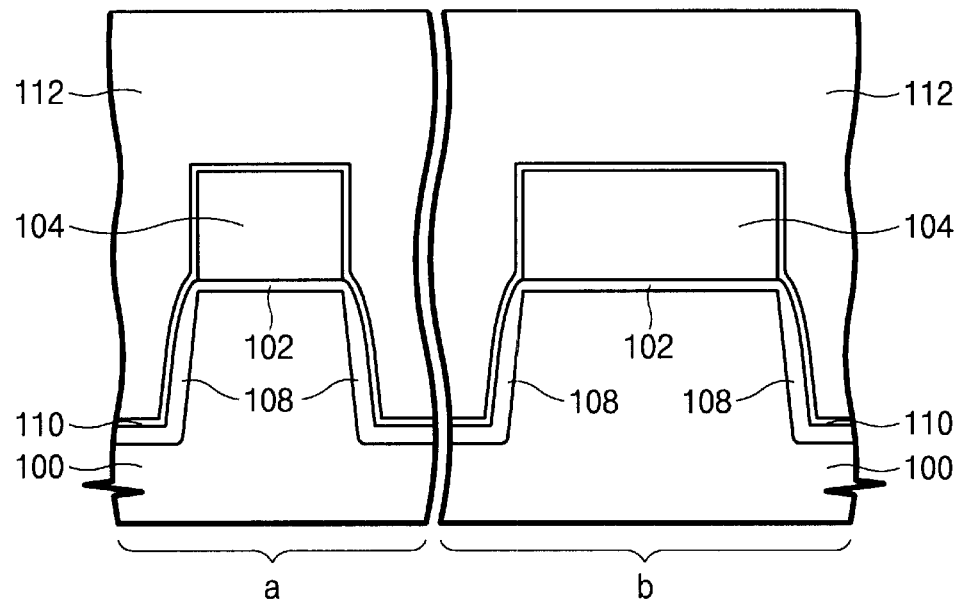
Figure 3:
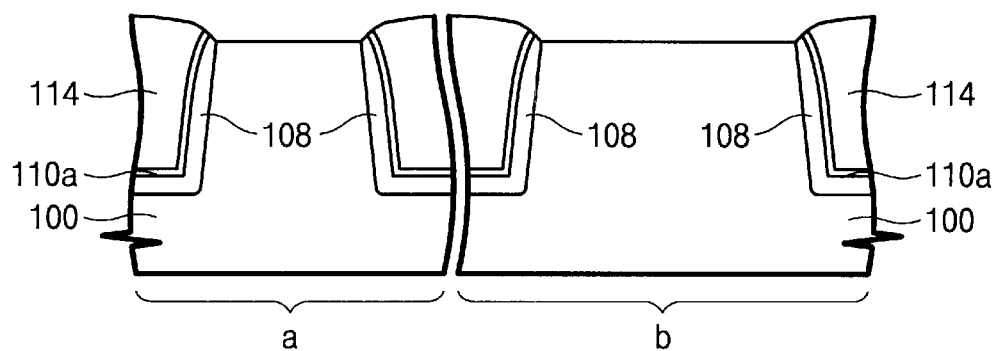
Figure 4:
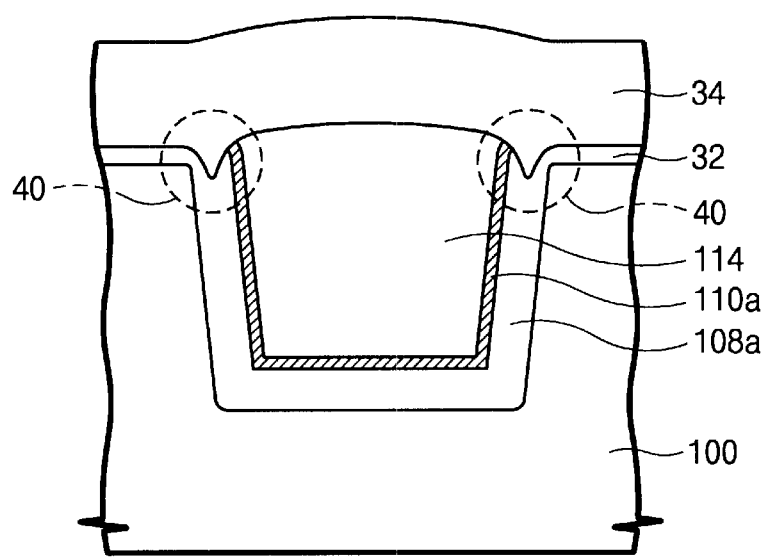
FIGS. 4 through 5 are cross-sectional views illustrating device isolation structures depending on the thickness of a trench oxide layer.
Figure 5:
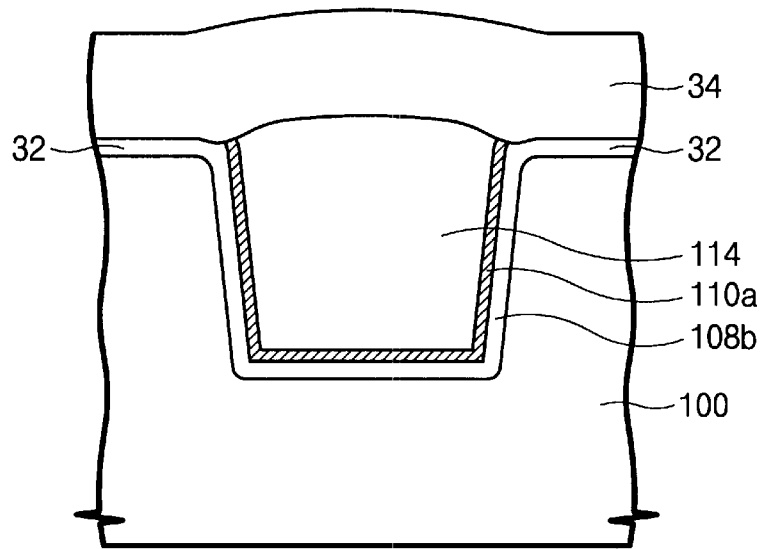
Figure 6:
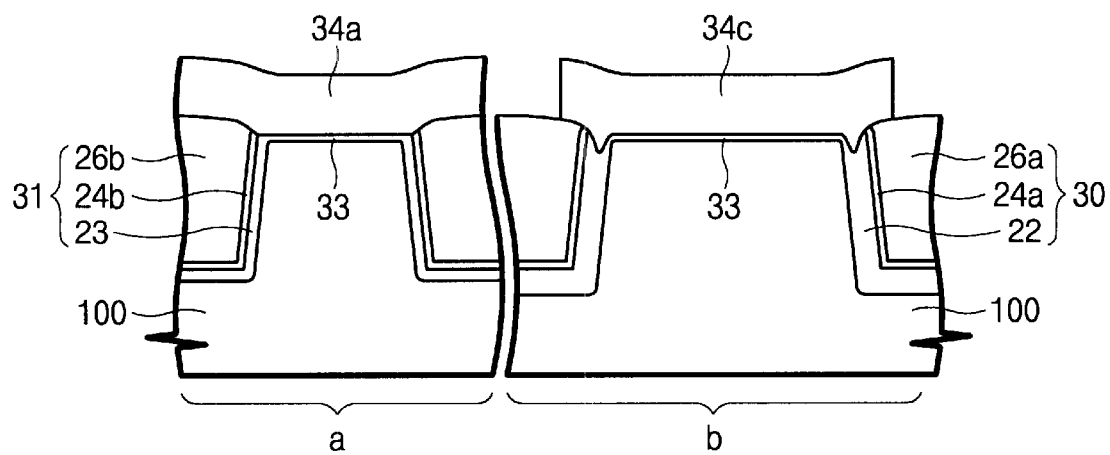
FIG. 6 is a cross-sectional view illustrating a semiconductor device according to an embodiment of the present invention.

FIG. 6 is a cross-sectional view illustrating a semiconductor device according to an embodiment of the present invention.

Referring to FIG. 6, a first device isolation layer 30 includes a first trench oxide layer 22, a first nitride liner 24a and a first insulation layer pattern 26a. The first device isolation layer 30 is formed in a peripheral circuit region "b". A second device isolation layer 31 includes a second trench oxide layer 23, a second nitride liner 24a and a second insulation layer pattern 26b. The second device isolation layer 30 is formed in a cell array region "a". The first device isolation layers 30 define an active region in the peripheral circuit region "b", and the second device isolation layers 31 define an active region in the cell array region "a". A peripheral circuit transistor gate 34c is formed on the active region between the first device isolation layers 30, and a gate dielectric layer 33 is interposed between the active region and the peripheral circuit transistor gate 34c. A cell transistor gate 34a is formed on the active region between the second device isolation layers 31, and another gate dielectric layer 33 is interposed between the active region and the cell transistor gate 34a. The gate dielectric layers 33 each can be formed with different thickness in the cell array region "a" and the peripheral circuit region "b".

As illustrated in FIG. 6, the second device isolation layer 31 in the cell array region (a) has the relatively thin trench oxide layer 23 thinner than the trench oxide layer 22 to prevent an inverse narrow-width effect at the cell transistor. On the contrary, the first device isolation layer 30 of the peripheral circuit region "b" has the relatively thick trench oxide layer 22 thicker than the trench oxide layer 23 of the cell array region "a" to prevent a charge effect trapped within a nitride liner. Thus, it is possible to solve conventional leakage current problems in cell and PMOS transistors that occur when device isolation layers in a cell array region and a peripheral circuit region are formed at the same time. Preferably, the first trench oxide layer 22 have a thickness of 100 Å to 200 Å and the second trench oxide layer 23 have a thickness of 50 Å to 100 Å.

FIGS. 7 through 13 are cross-sectional views illustrating a method for fabricating a semiconductor device according to an embodiment of the present invention.

Figure 7:
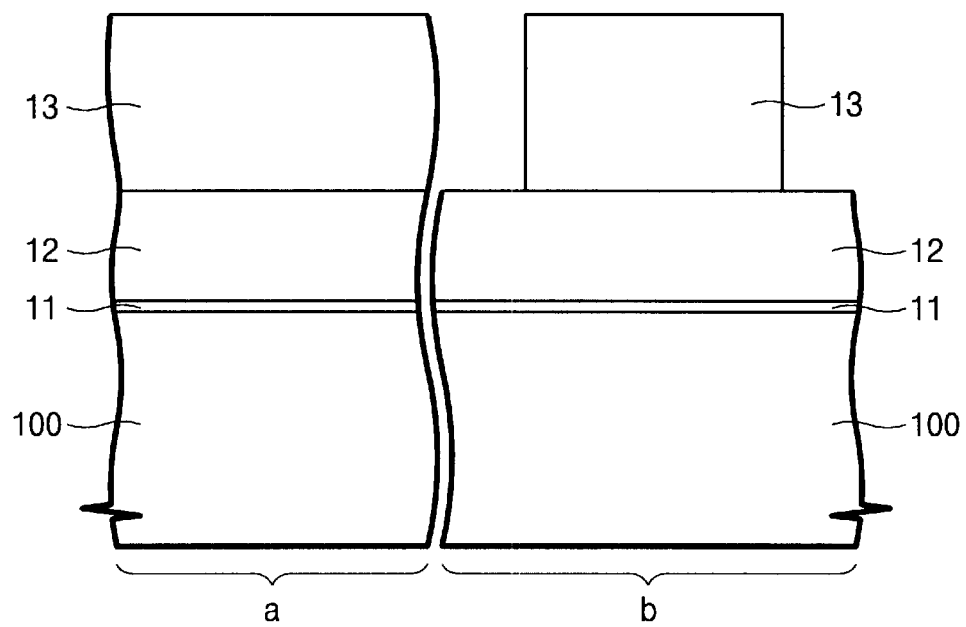
FIGS. 7 through 13 are cross-sectional views illustrating a method of fabricating a semiconductor device according to another embodiment of the present invention.

Referring to FIG. 7, a buffer oxide layer 11 and a hard mask layer 12 are sequentially formed in the regions of the cell array "a" and the peripheral circuit "b". A first photoresist pattern 13 is formed on the hard mask layer 12.

Preferably, the buffer oxide layer 11 has a thickness of 100 Å to 200 Å so that the buffer oxide layer 11 absorbs the stress applied on the semiconductor substrate 100 due to the presence of the hard mask layer 12. Ideally, the hard mask layer 12 is a material layer having an etch selectivity with respect to the semiconductor substrate 100. Thus, it is desired that the hard mask layer is formed by, for example, a silicon nitride layer or by sequentially stacking the silicon nitride layer and an oxide layer. Also, the hard mask layer 12 is preferably formed to a thickness of 500 Å to 2,000 Å.

Figure 8:
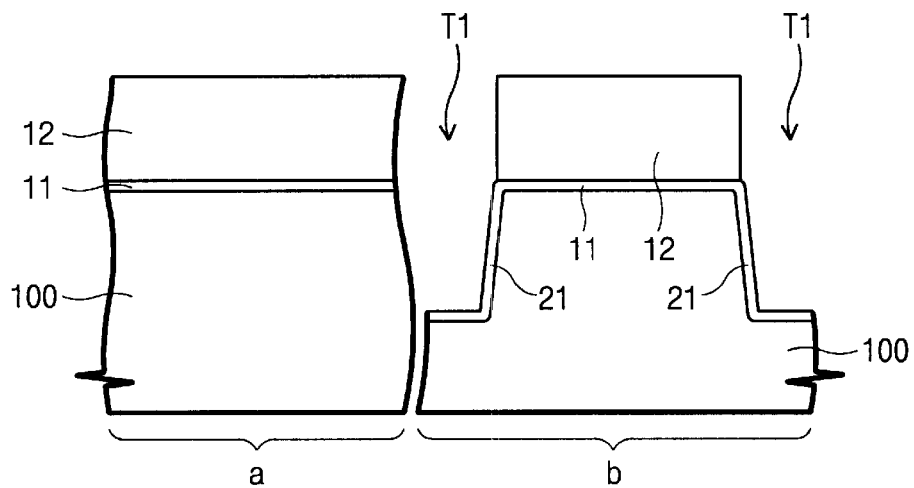

Referring to FIG. 8, the hard mask layer 12, the buffer oxide layer 11 and the semiconductor substrate 100 are sequentially etched using the first photoresist pattern 13 as an etch mask to form a first trench region T1 in the peripheral circuit region "b". Then, the first photoresist pattern 13 is removed, and a first thermal oxidation process is performed to form a preliminary oxide layer 21 on the sidewalls and the bottom of the first trench region T1.

The first trench region is preferably formed by etching the semiconductor substrate 100 to a thickness of 2,000 Å to 10,000 Å. The preliminary oxide layer 21 is preferably formed to a thickness of 50 Å to 100 Å.

Figure 9:
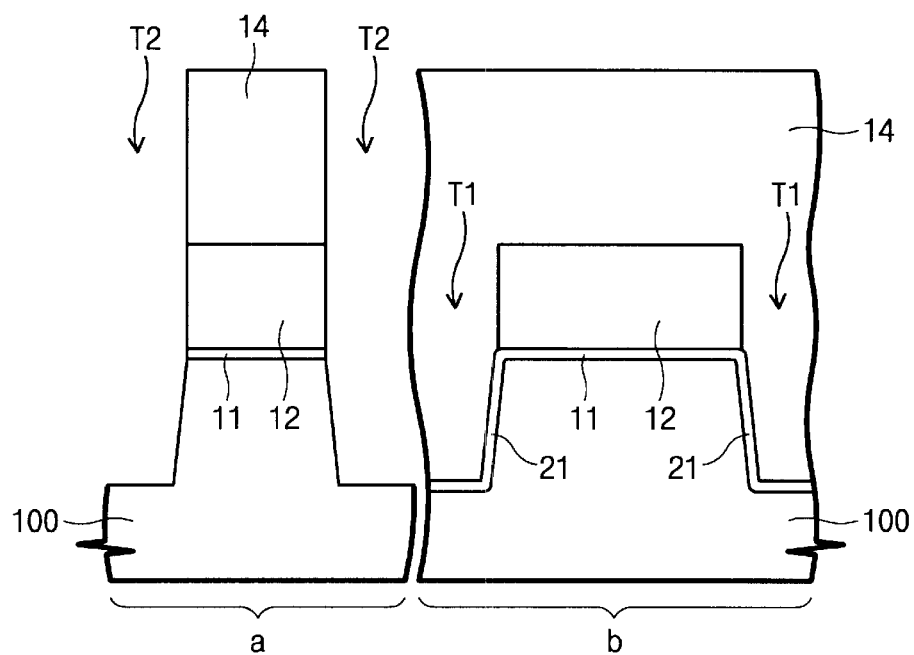

Referring to FIG. 9, a second photoresist pattern 14 is formed to cover the first trench region T1 in the peripheral circuit region "b" and to expose a predetermined region of the cell array region "a". The hard mask layer 12, the buffer oxide layer 11 and the semiconductor substrate 100 are sequentially etched using the second photoresist pattern 14 as an etch mask to form a second trench region T2 in the cell array region "a".

The second trench region T2 can be formed to a thickness different from that of the first trench region T1, depending on the application. For example, if the width of the second trench region T2 is narrower than that of the first trench region T1, the second trench region T2 can be formed shallow to prevent voids during the formation of a device isolation layer.

Figure 10:
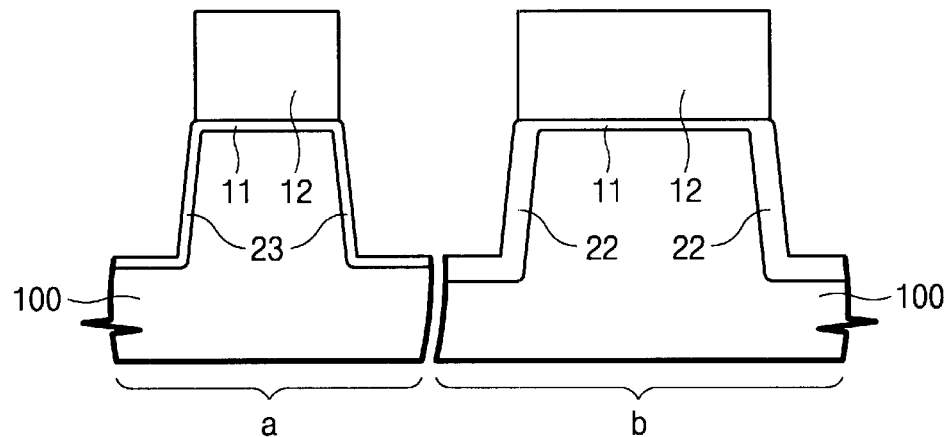

Referring to FIG. 10, the second photoresist pattern 14 is removed, and a second thermal oxidation process is performed on the semiconductor substrate 100. The second thermal oxidation process is performed to cure defects made to the semiconductor substrate occurring while the semiconductor substrate is etched to form the second trench region T2. Also, the second thermal oxidation process is performed to form a thermal oxide layer having a thickness of 50 Å to 100 Å on the bottom and the sidewalls of the second trench region T2. During the second thermal oxidation process, the first trench region T1 is also oxidized to add more thermal oxide layer to the preliminary oxide layer 21 that has been formed in the first thermal oxidation process. As a result, the thick first trench oxide layer 23 of a thickness of 100 Å to 200 Å is formed in the first trench region T1, and the second trench oxide layer 22 of 50 Å to 100 Å is formed in the second trench region T2.

Figure 11:
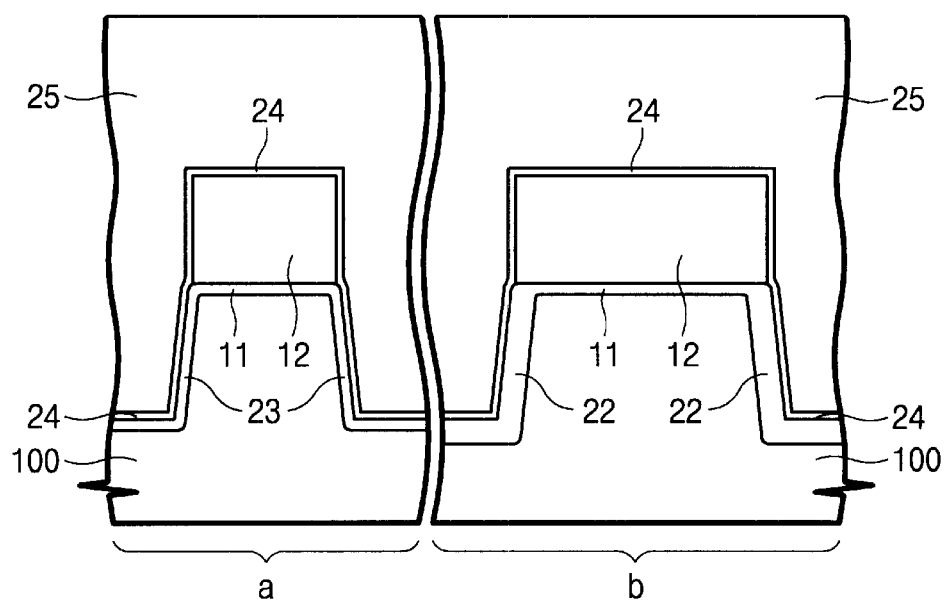

Referring to FIG. 11, a nitride layer 24 is conformally formed on the surface of the resulting structure where the first trench oxide layer 23 and the second trench oxide layer 22 are formed. The nitride layer 24 is preferably formed to a thickness of 50 Å to 200 Å. Then, an insulation layer 25 is formed on the nitride layer 24 to fill the first and the second trench regions T1 and T2. The insulation layer 25 is preferably formed of one of a high density plasma chemical vapor deposition (HDP CVD) oxide layer, a borophosphosilicate glass (BPSG) layer and an $O_3$-TEOS layer as a material layer having a superior burial characteristic. If the insulation layer 25 is a HDP CVD layer, a plasma having high energy is used. Thus, in order to prevent etching the nitride liner 24 by plasma of high energy, it is desired that a medium temperature oxide (MTO) layer is conformally formed before forming the HDP CVD layer.

Figure 12:
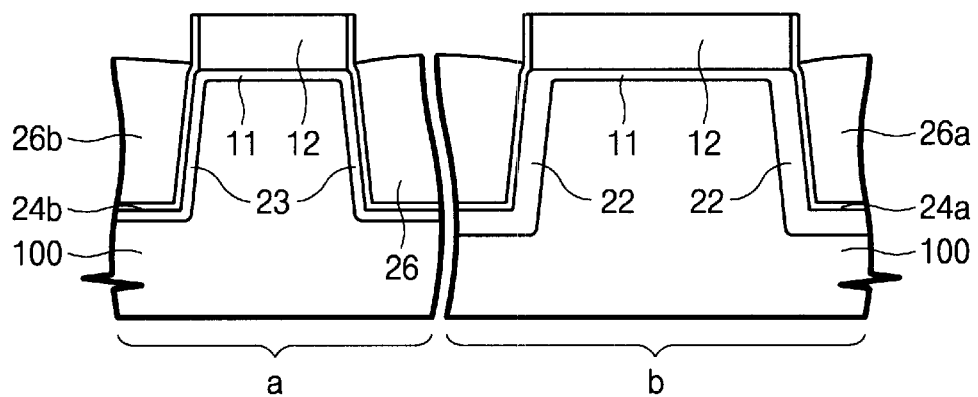

Referring to FIG. 12, the insulation layer 25 is etched using a chemical mechanical polishing (CMP) process to expose the hard mask layer 12 between the trench regions T1, T2. At this time, in order to prevent the insulation layer 25 from remaining at the top of the hard mask layer 12, it is desired that the top of the hard mask layer 12 be partially etched. As a result, a first nitride liner 24a is formed on the first trench oxide layer 22, and a first insulation layer pattern 26a is formed in the region surrounded by the first nitride liner 24a. Likewise, a second nitride liner 24b is formed on the second trench oxide layer 23, and a second insulation layer pattern 26b is formed in the region surrounded by the second nitride liner 24b. Then, the top of the first and the second insulation layer patterns 26 are recessed to lower the height of the top surface of the first and the second insulation layer patterns 26. This reduces a step difference of gate electrodes extending across the top surfaces of the semiconductor substrate and the device isolation layer.

Figure 13:
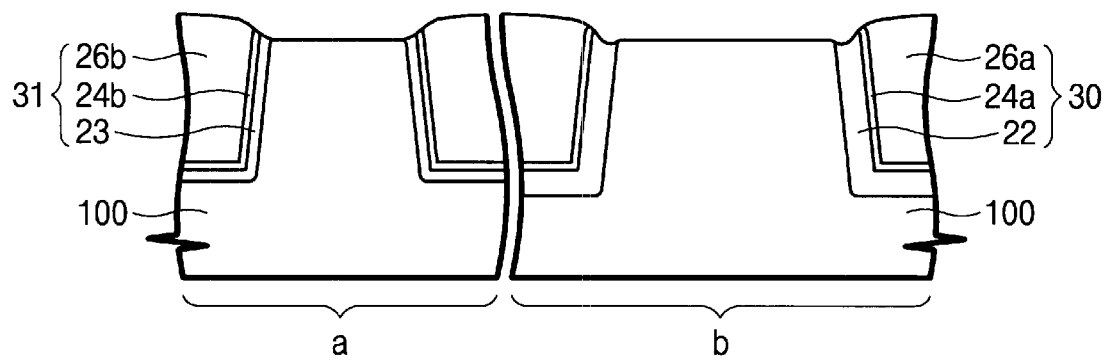

Referring to FIG. 13, the remaining hard mask layer 12, the first nitride liner 24a and the second nitride liner 24b are removed using conventional techniques such as a isotropic wet etching method utilizing a phosphoric acid solution. The buffer oxide layer 11 is removed. As a result, the first device isolation layer 30 including the fist trench oxide layer 22, the first nitride liner 24a and the first insulation layer pattern 26a is formed in the peripheral circuit region "b". Also, the second device isolation layer 31 including the second trench oxide layer 23, the second nitride liner 24a and the second insulation layer pattern 26b is formed in the cell array region "a".

Subsequently, although not illustrated, the peripheral circuit includes the PMOS transistors having a wide gate width at the region between the first device isolation layers 30. The cell array includes capacitors and cell transistors having a narrow gate width at the regions between the second device isolation layers 31.

As described above, the semiconductor device of the present invention has device isolation layers including trench oxide layers each having a different thickness in the cell array region and in the peripheral circuit region. Consequently, it is possible to reduce the current leakage from the cell capacitor, and to reduce the charge trapped in the PMOS transistors in the peripheral circuit.

In the drawings and specification, there have been disclosed typical preferred embodiments of the invention and, although specific terms are employed, they are used in a generic and descriptive sense only and not for purpose of limitation, the scope of the invention being set forth in the following claims.

What is claimed is:

1. A semiconductor device, comprising:
   first and second trench regions formed in first and second areas of a semiconductor substrate, respectively;
   a first device isolation layer formed in the first trench region, the first device isolation layer including a first trench oxide layer formed on side walls of the first trench region, a first nitride liner formed on side walls of the first trench oxide layer and a first insulation layer pattern formed on the first nitride liner to fill the first trench region; and a second device isolation layer formed in the second trench region, the second device isolation layer including a second trench oxide layer formed on side walls of the second trench region, a second nitride liner formed on side walls of the second trench oxide layer and a second insulation layer pattern formed on the second nitride liner to fill the second trench region, wherein the first trench oxide layer is substantially thicker than the second trench oxide layer.

2. The semiconductor device of claim 1, wherein the first area corresponds to a peripheral circuit region including PMOS transistors.

3. The semiconductor device of claim 1, wherein the second area corresponds to a cell array region.

* * * * *